(12) United States Patent
Hung et al.

(10) Patent No.: US 9,165,680 B2
(45) Date of Patent: Oct. 20, 2015

(54) MEMORY INTEGRATED CIRCUIT WITH A PAGE REGISTER/STATUS MEMORY CAPABLE OF STORING ONLY A SUBSET OF ROW BLOCKS OF MAIN COLUMN BLOCKS

(71) Applicant: Macronix International Co., Ltd., Hsinchu (TW)

(72) Inventors: Shuo-Nan Hung, Jhubei (TW); Chi Lo, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 211 days.

(21) Appl. No.: 14/036,997

(22) Filed: Sep. 25, 2013

(65) Prior Publication Data
US 2014/0254297 A1    Sep. 11, 2014

Related U.S. Application Data

(60) Provisional application No. 61/775,734, filed on Mar. 11, 2013.

(51) Int. Cl.
*G11C 29/04* (2006.01)
*G11C 29/00* (2006.01)

(52) U.S. Cl.
CPC .............. *G11C 29/04* (2013.01); *G11C 29/808* (2013.01); *G11C 29/82* (2013.01)

(58) Field of Classification Search
CPC .. G11C 29/787; G11C 29/789; G11C 29/785; G11C 29/808; G11C 29/812; G11C 29/70; G11C 7/1057; G11C 7/1051
USPC ............ 365/200, 201, 225.7, 189.05, 230.03; 714/711, 710
See application file for complete search history.

(56) References Cited

U.S. PATENT DOCUMENTS

| | | |
|---|---|---|
| 5,077,691 A | 12/1991 | Haddad et al. |
| 5,126,973 A | 6/1992 | Gallia et al. |
| 5,325,334 A | 6/1994 | Roh et al. |
| 5,537,665 A | 7/1996 | Patel et al. |
| 5,590,085 A | 12/1996 | Yuh et al. |
| 5,621,691 A | 4/1997 | Park |
| 5,732,030 A | 3/1998 | Dorney |
| 5,812,466 A | 9/1998 | Lee et al. |

(Continued)

OTHER PUBLICATIONS

USPTO Office Action dated Jun. 6, 2014 for related U.S. Appl. No. 12/893,235, pp. 1-16.

(Continued)

*Primary Examiner* — Andrew Q Tran
(74) *Attorney, Agent, or Firm* — Kenta Suzue; Haynes Beffel & Wolfeld LLP

(57) ABSTRACT

An integrated circuit includes an array of memory cells that is arranged into rows, main columns, and redundant columns that perform repairs in the array. The main columns and the redundant columns are divided into row blocks. Bit lines couple the main columns to status memory indicating repair statuses of the repairs by the redundant columns. The integrated circuit receives a command, and performs an update on the status memory with the repair statuses specific to particular ones of the row blocks in a portion of the memory accessed by the command. Alternatively or in combination, the status memory has insufficient size to store the repair statuses of multiple ones of the row blocks of the main columns.

18 Claims, 7 Drawing Sheets

(56) References Cited

U.S. PATENT DOCUMENTS

| | | |
|---|---|---|
| 5,953,270 A | 9/1999 | Kim |
| 5,959,904 A | 9/1999 | Oh |
| 5,999,463 A | 12/1999 | Park et al. |
| 6,002,620 A | 12/1999 | Tran et al. |
| 6,094,384 A | 7/2000 | Ka |
| 6,115,300 A | 9/2000 | Massoumi et al. |
| 6,141,268 A | 10/2000 | Chen et al. |
| 6,205,515 B1 | 3/2001 | Huang |
| 6,317,355 B1 | 11/2001 | Kang |
| 6,337,816 B1 | 1/2002 | Park et al. |
| 6,343,037 B1 | 1/2002 | Park et al. |
| 6,445,626 B1 | 9/2002 | Hsu et al. |
| 6,490,208 B2 | 12/2002 | Yoon |
| 6,496,425 B1 | 12/2002 | Abedifard et al. |
| 6,603,690 B1 | 8/2003 | Chen et al. |
| 6,665,221 B2 | 12/2003 | Abedifard et al. |
| 6,671,214 B2 | 12/2003 | Abedifard et al. |
| 6,674,676 B1 | 1/2004 | Hsu et al. |
| 6,678,191 B2 * | 1/2004 | Lee et al. .................. 365/185.33 |
| 6,915,467 B2 | 7/2005 | Pilo |
| 6,966,012 B1 | 11/2005 | Gandhi |
| 7,064,990 B1 | 6/2006 | Dawson et al. |
| 7,134,057 B1 | 11/2006 | Kaushik et al. |
| 7,251,173 B2 | 7/2007 | Lunde et al. |
| 7,570,536 B2 | 8/2009 | Chi |
| 7,738,308 B2 | 6/2010 | Afghahi et al. |
| 7,760,553 B2 * | 7/2010 | Jang ........................ 365/185.22 |
| 2004/0123181 A1 | 6/2004 | Moon et al. |
| 2009/0180340 A1 | 7/2009 | Song et al. |
| 2010/0107004 A1 | 4/2010 | Bottelli et al. |
| 2012/0075943 A1 | 3/2012 | Chen et al. |

OTHER PUBLICATIONS

USPTO Office Action dated Oct. 10, 2013 for related U.S. Appl. No. 12/893,235, pp. 1-16.

* cited by examiner

MEMORY INTEGRATED CIRCUIT WITH A PAGE REGISTER/STATUS MEMORY CAPABLE OF STORING ONLY A SUBSET OF ROW BLOCKS OF MAIN COLUMN BLOCKS

RELATED APPLICATIONS

This application claims the benefit of U.S. Provisional Application No. 61/775,734 filed 11 Mar. 2013, which is incorporated herein by reference.

BACKGROUND

Redundant columns in a memory array improve the manufacturing yield of a memory integrated circuit. Defects in the memory array are repaired by, for example, swapping out a typical column in the memory array which has a defect, and swapping in a redundant column as a replacement for the defective column, by appropriate processing of column addresses.

Defects in a memory array may not be isolated to within a same column of the memory array. One approach to the problem of defects that occur in different columns of the memory array is to include more redundant columns. In this fashion, even defects that occur in different columns of the memory array can be addressed, by swapping out each of the defective columns and swapping in a redundant column. Unfortunately, this is an expensive solution because adding additional redundant columns consumes area.

Another approach to the problem of defects that occur in different columns of the memory array, is to divide the columns of the memory array into multiple segments, or row blocks. Defects which occur in different columns of the memory array may be replaced by the same redundant column, so long as the defects also occur in different row blocks of the columns. One example implementation is described in U.S. application Ser. No. 12/893,235.

Although the division of columns into multiple row blocks increases the area efficiency of redundant columns that repair defects, the multiple row blocks complicate the process of verifying a memory operation such as program or erase. If a row block of a column in the memory array has been replaced with a row block of a redundant column, then it does not make sense to verify the replaced row block. Accordingly, memory for each column of the status memory indicates whether or not to include particular memory columns in the verify process. Such status memory increases with the granularity of the division of columns into multiple row blocks.

It would be desirable to take advantage of the increased area efficiency of redundant columns which results from a defect repair system that divides memory columns and redundant columns into multiple segments or multiple row blocks, while mitigating the area penalty from the need to store larger volumes of repair status information for the verify process.

SUMMARY

One aspect of the technology is an integrated circuit including an array of memory cells which is arranged into rows and main columns, and a set of redundant columns that perform repairs in the array.

The main columns and the set of redundant columns are divided into row blocks. One or more of a particular one of the row blocks in one of the main columns is repairable by the particular one of the row blocks in one of the set of redundant columns.

The integrated circuit also includes status memory and control circuitry. Bit lines couple the main columns of the array to status memory indicating repair statuses of the repairs by the set of redundant columns. The control circuitry, responsive to the integrated circuit receiving a command, performs an update on the status memory with the repair statuses of only a subset of the row blocks of the plurality of main columns.

Accordingly, the update includes repair statuses of fewer than all of the row blocks of the plurality of main columns. In some embodiments of the technology, the repair statuses in the update exclude particular ones of the row blocks outside a portion of the memory accessed by the command. In such embodiments, the command determines the scope of the update.

In some embodiments of the technology, the repair statuses identify repaired main columns in the main columns that include the repairs in a portion of the memory accessed by the command. The repaired main columns include row blocks that have been replaced by row blocks of redundant columns. In some embodiments of the technology, the control circuitry is responsive to the repair statuses by excluding the repaired main columns from a result of a memory verify procedure for the command. The memory verify procedure thus excludes main columns with repairs, such as when the accessed row block of the command includes repairs that have been repaired with a row block of a redundant column.

In some embodiments of the technology, the control circuitry performs the update at least partly during a setup time of a memory operation voltage that exceeds a supply voltage range of the memory. Such timing mitigates memory latency resulting from the update.

Another aspect of the technology is also an integrated circuit including an array of memory cells which is arranged into rows and main columns, and a set of redundant columns that repair the array. Bit lines couple the main columns of the array to status memory indicating repair statuses of the main columns. The status memory has insufficient size to store the repair statuses of multiple ones of the row blocks of the main columns.

In some embodiments of the technology, the row blocks in any one of the set of redundant columns repair different main columns of the plurality of main columns. In some embodiments of the technology, the status memory does not include repair statuses of the row blocks outside a portion of the memory accessed by a command received by the integrated circuit.

In some embodiments of the technology, the repair statuses identify repaired main columns in the main columns that include the repairs in a portion of the memory accessed by a command received by the integrated circuit.

In some embodiments of the technology, the repair statuses identify repaired main columns in the main columns that include the repairs in a portion of the memory accessed by a command received by the integrated circuit. The integrated circuit further comprises control circuitry responsive to the repair statuses by excluding the repaired main columns from a result of a memory verify procedure for the command.

Some embodiments of the technology further comprise control circuitry that performs an update on the status memory with the repair statuses specific to particular ones of the row blocks in a portion of the memory accessed by a command received by the integrated circuit. The update is at least partly during a setup time of a memory operation voltage that exceeds a supply voltage of the integrated circuit.

Other aspect of the technology are directed to methods described herein.

DETAILED DESCRIPTION

Figure 1:
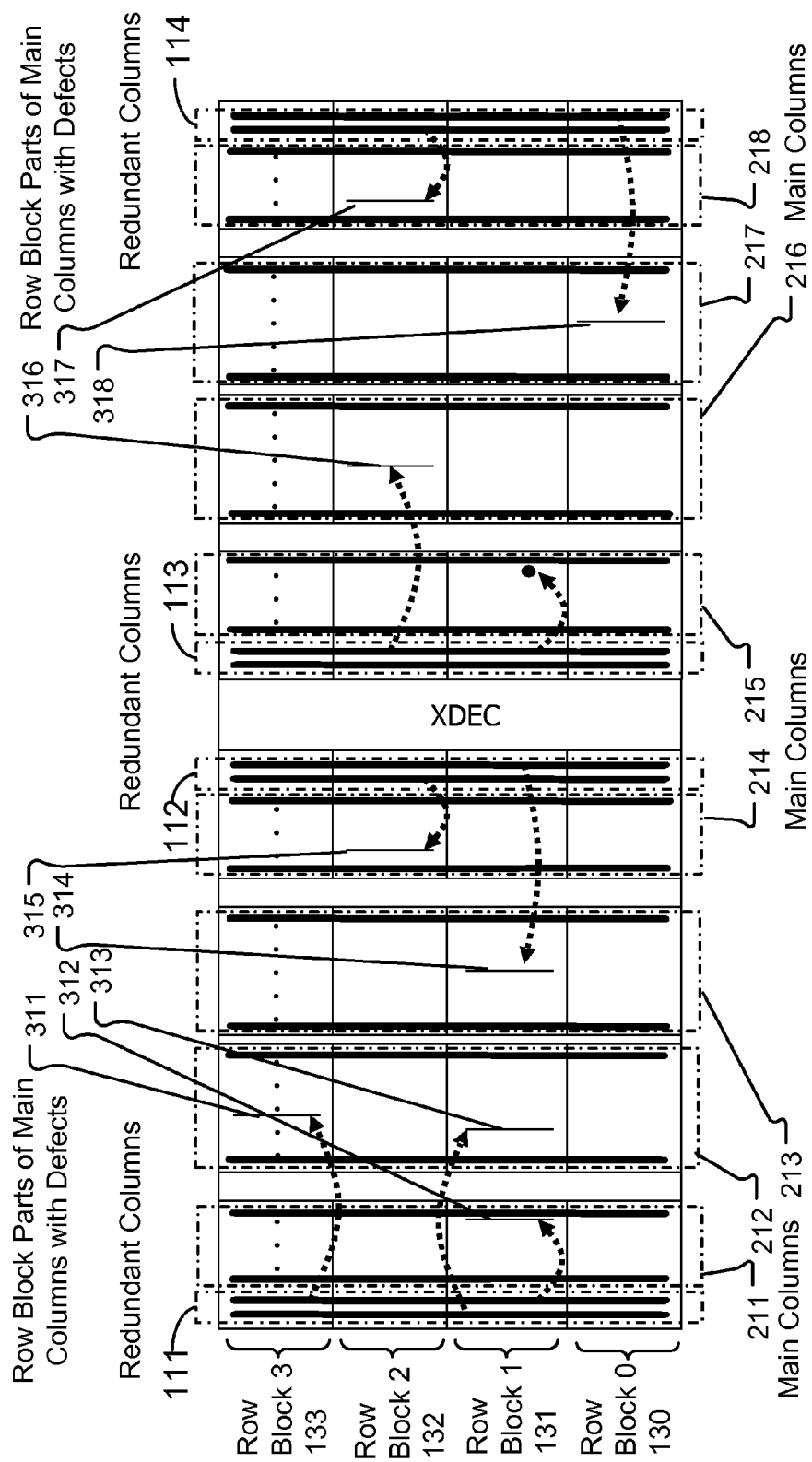
FIG. 1 is a simplified diagram of a memory array with redundant columns that can repair memory defects in different row blocks of the memory array.

FIG. 1 is a simplified diagram of a memory array with one or more redundant columns that can repair memory defects in different row blocks of the memory array.

The memory array includes main columns 211, 212, 213, 214, 215, 216, 217, and 218, which each extends through all of the row blocks, which include row block 0 130, row block 1 131, row block 2 132, and row block 3 133. The main columns on the extreme sides of each column block are shown, with ellipsis showing that main columns fill the intervening space within the column block. The memory array also includes redundant columns 111, 112, 113, and 114, which each extends through all of the row blocks, which include row block 0 130, row block 1 131, row block 2 132, and row block 3 133. The redundant columns repair errors in the main columns. Data in the redundant columns can also be updated, regardless of defects.

Embodiments of the technology provide a column repair method and algorithm having a highly efficient repair rate. Each redundant column is divided by N (N=2, 3 . . . to a maximum of the sector number in the Y-axis direction). The repair information is stored in a nonvolatile memory of a redundancy system, and during power on downloaded to a memory, such as registers (or fuses) of a pager buffer. Hence, the repair rate increases by a factor of up to N times, compared with a relatively inefficient repair rate associated with replacing an entire main column.

In FIG. 1, each column block has its own redundant columns 111/112/113/114. Each redundant column is divided by N in the Y-axis direction. As shown, N=4, but N can be increased up to the sector number in the Y-axis direction. The same redundant column fixes defects in up to N different main columns, so long as the defects are in different row blocks.

FIG. 1 shows row block parts of main columns with defects 311, 312, 313, 314, 315, 316, 317, and 318, illustrating that the replaceable unit is by row block portion of a main column by a row block portion of a redundant column.

Defects in different main columns and in different row blocks are repairable by a same redundant column or different redundant columns. Defects in different main columns and in a same row block are repairable by different redundant columns.

Figure 2:
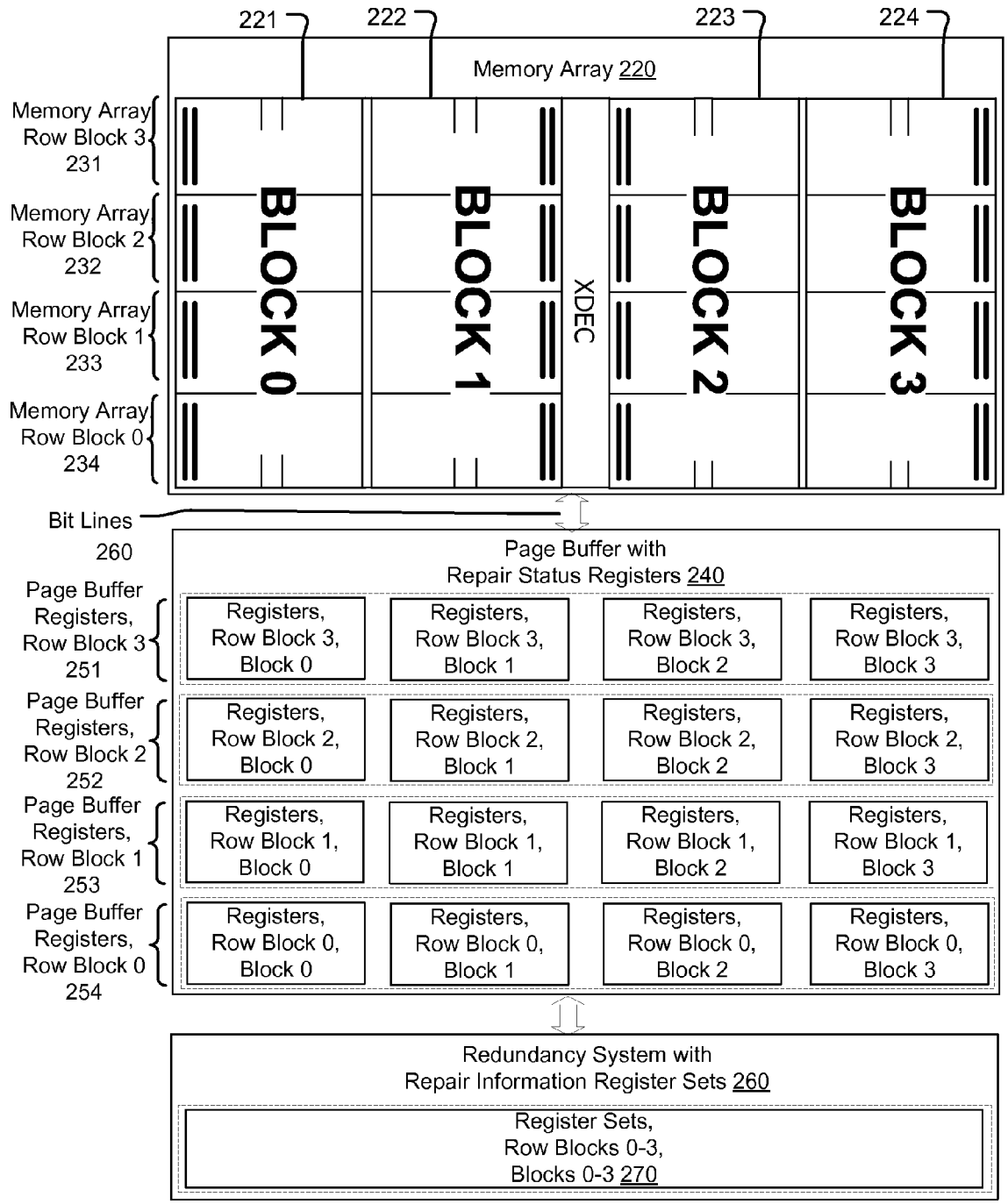
FIG. 2 is a simplified architecture diagram of a memory array, such as in FIG. 1, along with the registers of a page buffer, and a redundancy system.

FIG. 2 is a simplified architecture diagram of a memory array, such as in FIG. 1, along with the registers of a page buffer and a redundancy system.

The memory array 220 includes several column blocks. Each column block—BLK0 221, BLK1 222, BLK2 223, and BLK3 224—has multiple main columns, and two or more redundant columns. Various embodiments have a different number of column blocks, a various number of columns per block, and a different number of redundant columns per column block. Redundant columns are divided by N (for example, N=4 in the figure), where N can be increased up to the sector number in the Y-axis direction. Each part of a redundant column—where a redundant column is divided into multiple parts by the row blocks—can repair a defect in a main column in its own corresponding row block.

The memory array 220 is coupled to a page buffer 240 which includes multiple registers. The multiple registers store the repair statuses which identify repaired main columns in the main columns that include the defects in a portion of the memory accessed by the memory command, and have been replaced by corresponding row blocks of redundant columns. The number of registers is sufficiently large to indicate the repair status of every row block of every column block.

The page buffer 240 includes page buffer registers for row block 3 251 (for blocks 0, 1, 2, 3); page buffer registers for row block 2 252 (for blocks 0, 1, 2, 3); page buffer registers for row block 1 253 (for blocks 0, 1, 2, 3); and page buffer registers for row block 0 254 (for blocks 0, 1, 2, 3). In prior technology, when entire columns were repaired by replacement with entire columns, the registers were large enough for a single set of column blocks, as there was no division of the columns into multiple row blocks. However, the shown embodiment increases the capacity of the page buffer registers with the number of row blocks in the memory array 220. The page buffer registers, or status memories, are coupled to the main columns of the memory array via bit lines 260. Each bit line is coupled to a corresponding page buffer register.

The page buffer 240 is coupled to the redundancy system register sets 260, which includes nonvolatile register sets for row blocks 0-3, blocks 0-3 270. During power on, the contents of the page buffer registers 251-254 are populated depending on the contents of the register sets 270.

In another embodiment, the status registers are outside of the page buffer.

Figure 3:
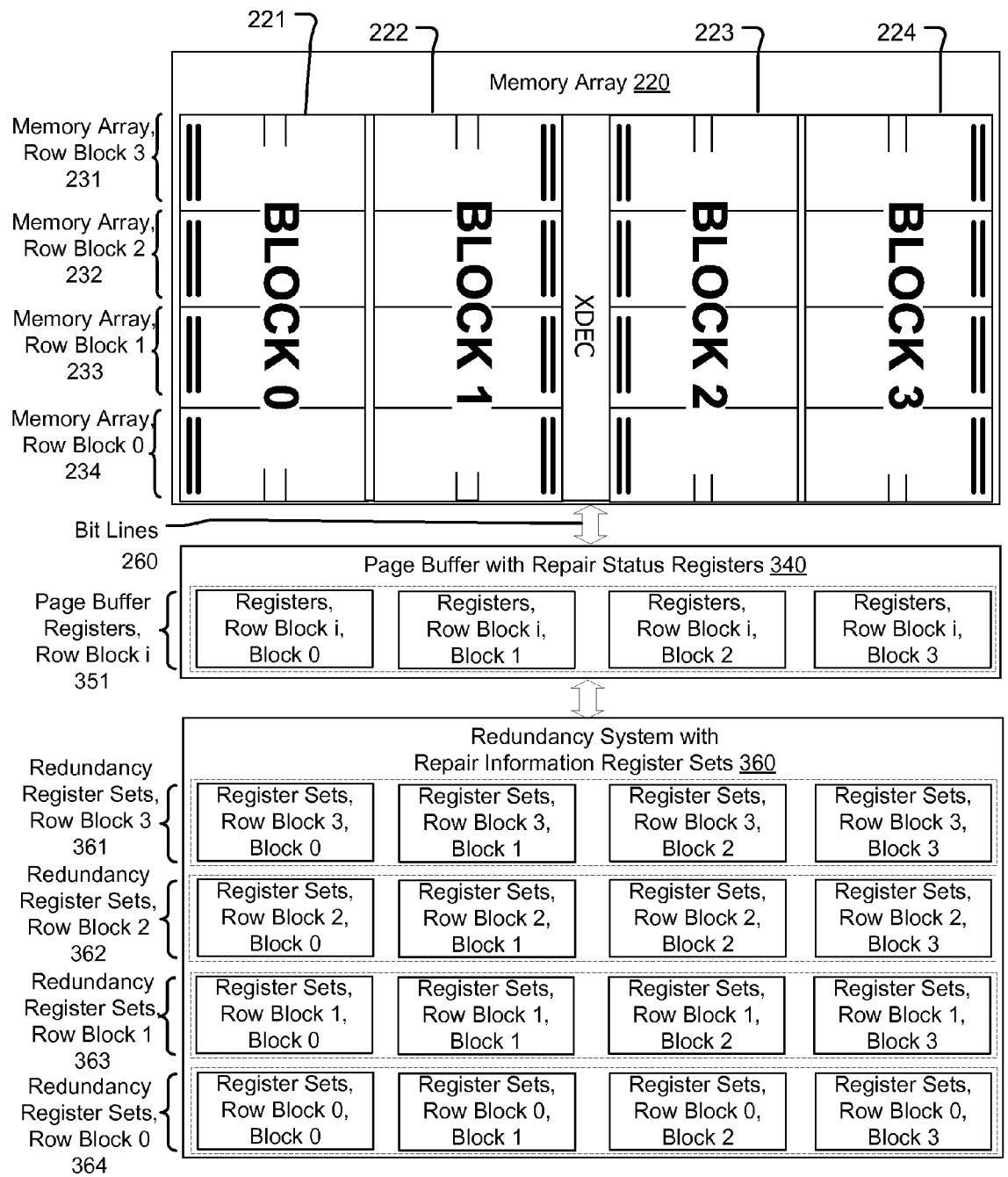
FIG. 3 is a simplified architecture diagram of a memory array, such as in FIG. 1, along with the reduced number of registers of a page buffer, and a redundancy system.

FIG. 3 is a simplified architecture diagram of a memory array, such as in FIG. 1, along with the reduced number of registers of a page buffer, and a redundancy system.

The memory array 220 of FIG. 3 is similar to FIG. 2. The memory array 220 is coupled to a page buffer 340 which includes multiple registers. The multiple registers store the repair statuses which identify repaired main columns in the main columns that include the defects in a portion of the memory accessed by the memory command, and have been replaced by corresponding row blocks of redundant columns. However, the number of registers is insufficient to indicate the repair statuses of every row block of every column block. Instead, the number of registers can store the repair status of only a subset of the row blocks of every column block. The page buffer includes page buffer registers for row block i 351 (for blocks 0, 1, 2, 3), where i depends on the row block which is being accessed by the present memory command. In the shown embodiment, the number of page buffer registers is sufficient to store only one row block of repair statuses for all the column blocks. Other embodiments have a number of page buffer registers sufficient to store multiple row block of repair statuses for all the column blocks, but still insufficient to indicate the repair statuses of every row block of every column block. The page buffer registers, or status memories, are coupled to the main columns of the memory array via bit lines 260. Each bit line is coupled to a corresponding page buffer register.

The page buffer 340 is coupled to the redundancy system register sets 360. The redundancy system register sets 360 include redundancy system register sets for row block 3 361 (for blocks 0, 1, 2, 3); redundancy system register sets for row block 2 362 (for blocks 0, 1, 2, 3); redundancy system register sets for row block 1 363 (for blocks 0, 1, 2, 3); and redundancy system register sets for row block 0 364 (for blocks 0, 1, 2, 3).

Because of the insufficient capacity of the page buffer registers 351 to store all of the repair statuses indicated by the redundancy system register sets 361, 362, 363, 364, the page buffer registers 351 store the repair statuses of a selected subset of the redundancy system register sets 361, 362, 363, 364. In one embodiment, the page buffer registers 351 store the repair statuses of one of the redundancy system register sets 361, 362, 363, 364. In another embodiment having a number of page buffer registers sufficient to store multiple row block of repair statuses for all the column blocks, but still insufficient to indicate the repair statuses of every row block of every column block, the page buffer registers 351 store the repair statuses of multiple ones but not all of the redundancy system register sets 361, 362, 363, 364.

In another embodiment, the status registers are outside of the page buffer.

Figure 4:
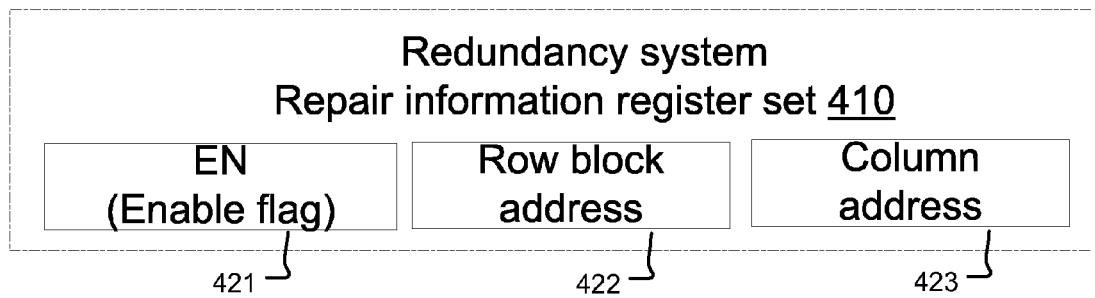
FIG. 4 is a simple diagram showing the data structure of a register set which can be stored by the redundancy system shown in FIG. 2 or 3.

FIG. 4 is a simple diagram showing the data structure of a register set which can be stored by the redundancy system shown in FIG. 2 or 3.

A redundancy system register set 410 includes an enable flag 421, a row block address 422, and a column address 423. After receipt by the integrated circuit of a memory instruction, the control circuitry identifies the row block address of the part of the memory array accessed by the received memory instruction. The row block address identified from the received memory instruction is compared with the row block addresses of the register sets in the redundancy system. All of the register sets in the redundancy system, which include a row block address that matches the row block address identified from the received memory instruction, are read from the redundancy system and stored into the page buffer registers in preparation to perform the received memory instruction.

Figure 5:
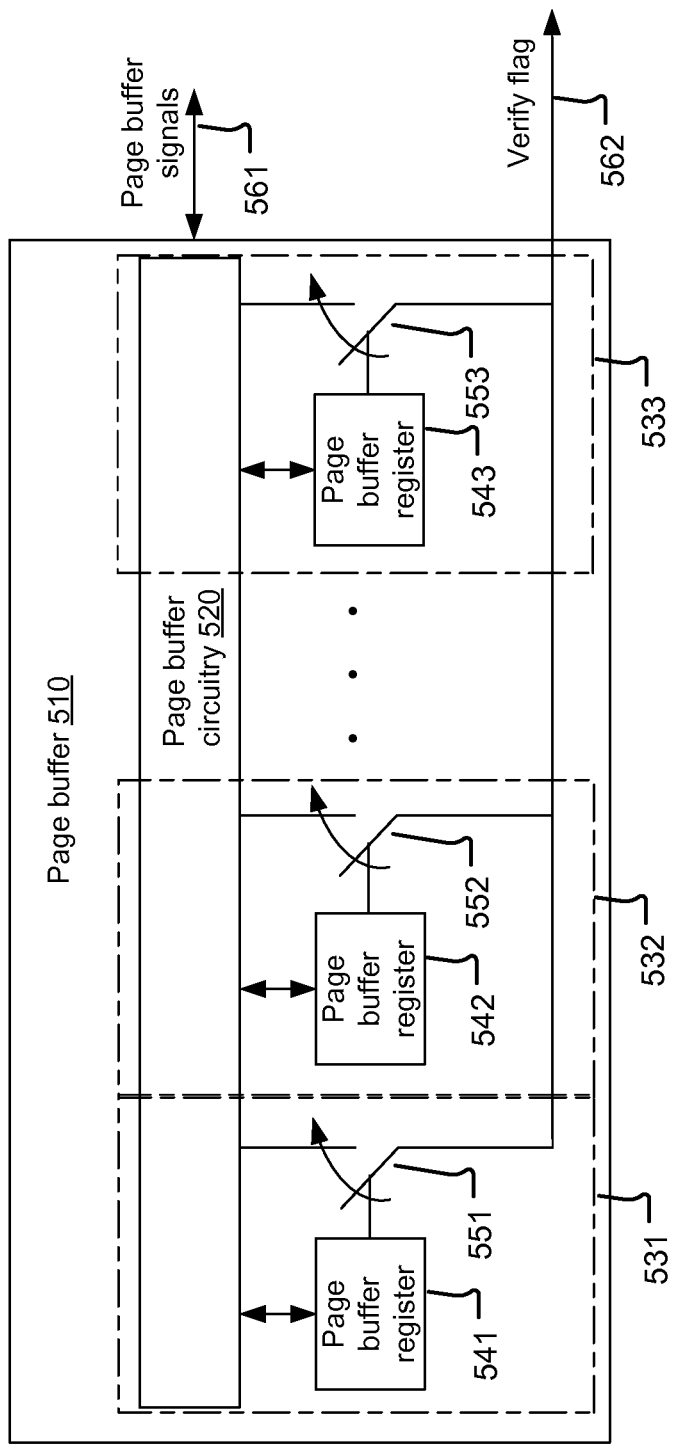
FIG. 5 is a simple block diagram illustrating how the page buffer registers remove repaired main columns from the results of a verify procedure.

FIG. 5 is a simple block diagram illustrating how the page buffer registers remove repaired main columns from the results of a verify procedure.

The page buffer 510 temporarily stores data which is programmed to, or read from, the memory array. Page buffer circuitry 520 includes the memory elements for storing the buffered data, and control circuitry of the page buffer. The page buffer 510 includes multiple repair units 531, 532, and 533. The actual number of repair units corresponds to the number of columns which are verified at a time. The repair units 531, 532, and 533 include corresponding page buffer registers 541, 542, and 543; and corresponding switches 551, 552, and 553. The page buffers registers 541, 542, and 543 store values read from the redundancy system register sets, as explained in connection with FIG. 3. Depending on the values stored in page buffer registers 541, 542, and 543, the switches 551, 552, and 553 are either open or closed. In the fashion, the result of a verify process either includes or excludes columns from a verify operation. A columns is excluded from a verify operation, if the accessed row block of the column has been repaired and replaced with the row block of a redundant column.

The page buffer signals 561 communicate data with the memory array for data read from the array or programmed to the array, and with the redundancy system. The verify flag 562 indicates whether the result of a verify process is either pass or fail.

Figure 6:
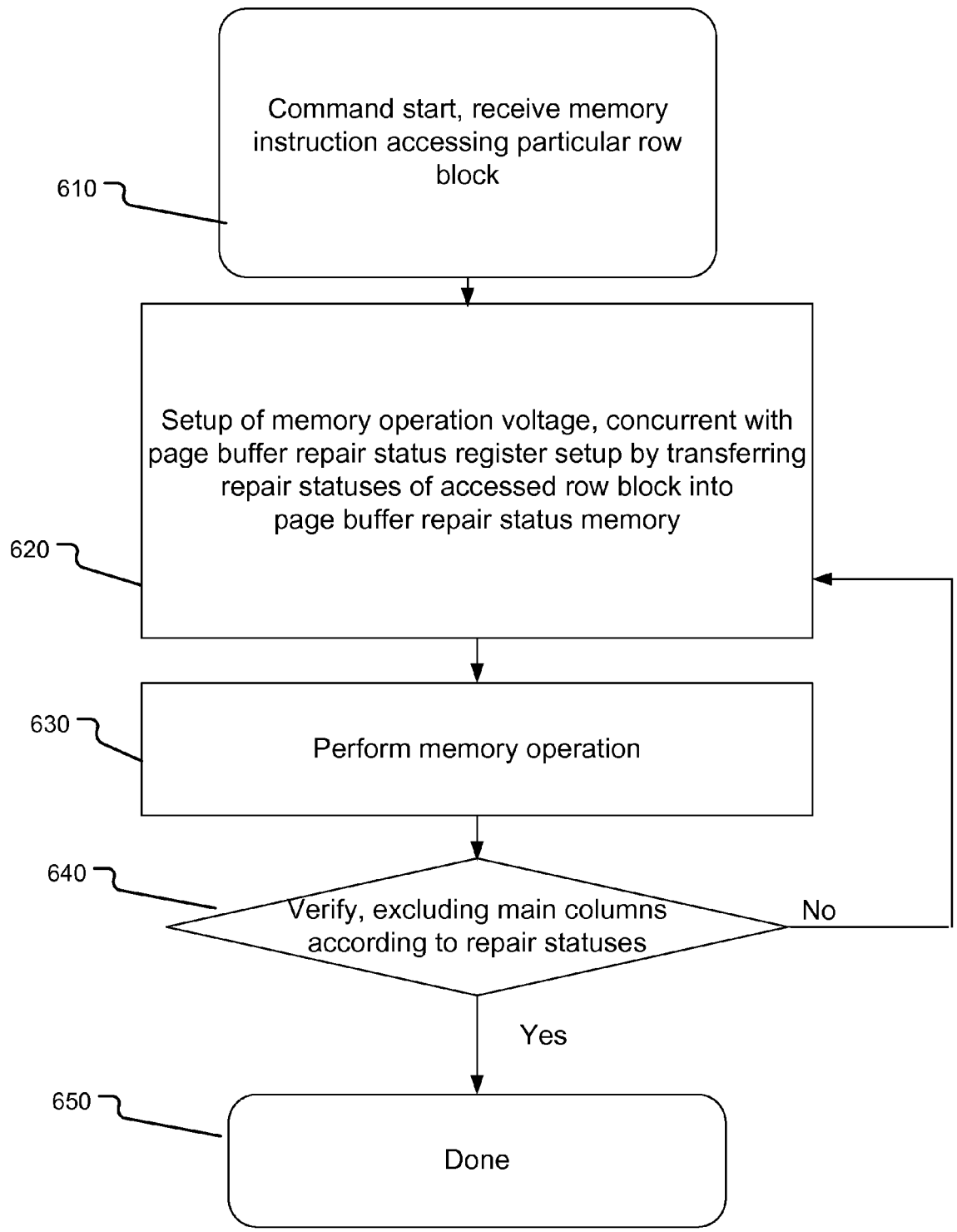
FIG. 6 is an example process flow of a memory operation with the reduced area of status registers.

FIG. 6 is an example process flow of a memory operation using the reduced area of page buffer registers.

At 610, a memory instruction is received at the integrated circuit, and the process flow begins. The memory instruction instructs the access of a particular row block. At 620, the memory operation such as program or erase requires a voltage which is outside the supply voltage range of the integrated circuit, so the high magnitude voltage is setup, such as with a charge pump. At this time, the page buffer registers are updated according to the redundancy system register sets, as discussed in connection with FIG. 3. Although the page buffer register architecture of FIG. 3 has a smaller area cost versus the page buffer register architecture of FIG. 2, extra steps are required to update the page buffer registers with the repair statuses of the correct row block. However, such extra steps result in no extra latency or little extra latency, because the update is performed at least partly during the voltage setup. At 630, the memory operation such as erase or program is performed. At 640, a verify process is performed. Main columns are excluded from the verify process as specified by the repair statuses in the status memory, to exclude row blocks with defects. If the verify succeeds, the process flow ends 650. Otherwise, the process flow loops back to 620.

Figure 7:
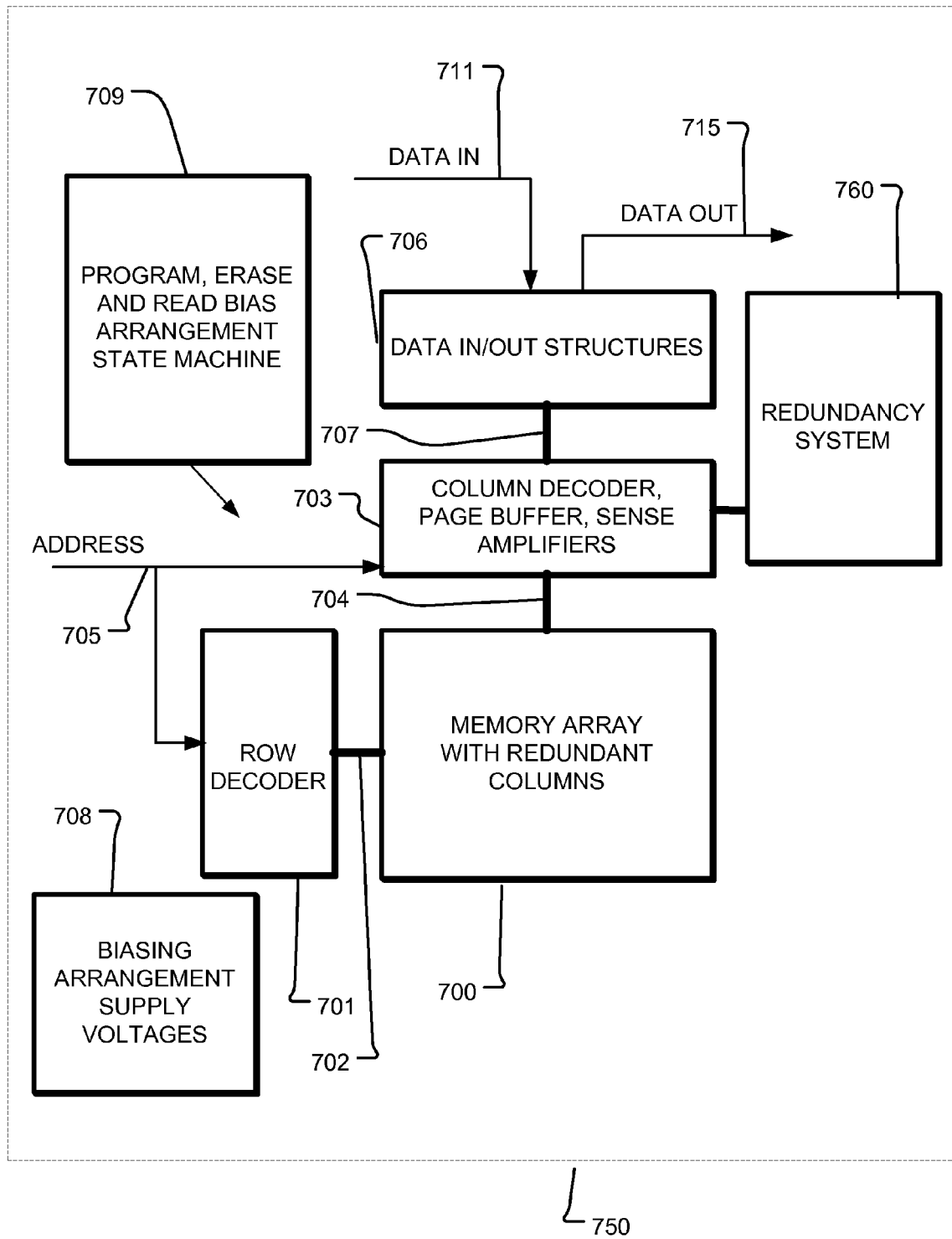
FIG. 7 shows a block diagram of an integrated circuit with the reduced area of status registers.

FIG. 7 shows an integrated circuit 750 including a memory array 700. A word line and block select decoder 701 is coupled to, and in electrical communication with, a plurality 702 of word lines, and arranged along rows in the memory array 700. A bit line decoder, page buffer, and sense amplifiers 703 are coupled to and in electrical communication with a plurality of bit lines 704 arranged along columns in the memory array 700 for reading data from, and writing data to, the memory cells in the memory array 700. The status memory storing repair statuses for a particular row block is in the page buffer, or alternatively, outside of the page buffer. Addresses are supplied on bus 705 to the word line decoder and drivers 701 and to the bit line decoder, page buffer, and sense amplifiers 703. Data-in/out structures in block 706, including current sources for the read, program and erase modes, are coupled to the bit line decoder, page buffer, and sense amplifiers 703 via the bus 707. Data is supplied via the data-in line 711 from input/output ports on the integrated circuit 750, to the data-in/out structures in block 706. Data is supplied via the data-out line 715 from the data in/out structures in block 706 to input/output ports on the integrated circuit 750, or to other data destinations internal or external to the integrated circuit 750. A bias arrangement state machine is in circuitry 709, controlling biasing arrangement supply voltages 708, in response to memory instructions received by the integrated circuit 750. The state machine 709 repairs multiple defects in the array with a redundant column, where defects include at least a first defect and a second defect in different main columns of the array. However, all of the multiple defects repaired by the same redundant column are not required to be in different main columns. Redundancy system 760 stores data about the repair statuses of the memory array columns divided into row blocks. The data of the redundancy system 760 is downloaded responsive to received memory instructions, and programmed to the status memory in 703.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
   an array of memory cells arranged into:
   a plurality of rows; and
   a plurality of main columns coupled to a plurality of bit lines;
   a set of redundant columns for repairing the array,
   wherein the plurality of main columns and the set of redundant columns are divided into row blocks, and a particular one of the row blocks in one of the plurality of main columns is repairable by the particular one of the row blocks in one of the set of redundant columns;
   status memory coupled to the plurality of bit lines, the status memory indicating repair statuses of the repairs by the set of redundant columns; and
   control circuitry that, responsive to the integrated circuit receiving a command, performs an update on the status memory with the repair statuses of only a subset of the row blocks of the plurality of main columns.

2. The integrated circuit of claim 1,
   wherein, the repair statuses in the update exclude particular ones of the row blocks outside a portion of the memory array accessed by the command.

3. The integrated circuit of claim 1,
   wherein, the repair statuses identify repaired main columns in the plurality of main columns that include the repairs in a portion of the memory array accessed by the command.

4. The integrated circuit of claim 1,
   wherein, the repair statuses identify repaired main columns in the plurality of main columns that include the repairs in a portion of the memory array accessed by the command, and
   wherein the control circuitry is responsive to the repair statuses by excluding the repaired main columns from a result of a memory verify procedure for the command.

5. The integrated circuit of claim 1,
   wherein, the control circuitry performs the update at least partly during a setup time of a memory operation voltage that exceeds a supply voltage range of the memory array.

6. An integrated circuit, comprising:
   an array of memory cells arranged into:
   a plurality of rows; and
   a plurality of main columns coupled to a plurality of bit lines;
   a set of redundant columns,
   wherein the plurality of main columns and the set of redundant columns are divided into row blocks, and a particular one of the row blocks in one of the plurality of main columns is repairable by the particular one of the row blocks in one of the set of redundant columns; and
   status memory coupled to the plurality of bit lines, the status memory indicating repair statuses of the plurality of main columns, the status memory having insufficient size to store the repair statuses of multiple ones of the row blocks of the plurality of main columns.

7. The integrated circuit of claim 6,
   wherein the row blocks in any one of the set of redundant columns perform repairs in different main columns of the plurality of main columns, and
   wherein, the status memory does not include repair statuses of the row blocks outside a portion of the memory array accessed by a command received by the integrated circuit.

8. The integrated circuit of claim 6,
   wherein, the repair statuses identify repaired main columns in the plurality of main columns that include repairs in a portion of the memory array accessed by a command received by the integrated circuit.

9. The integrated circuit of claim 6,
   wherein, the repair statuses identify repaired main columns in the plurality of main columns that include defect in a portion of the memory array accessed by a command received by the integrated circuit, and
   the integrated circuit further comprises:
   control circuitry responsive to the repair statuses by excluding the repaired main columns from a result of a memory verify procedure for the command.

10. The integrated circuit of claim 6, further comprising:
    control circuitry that performs an update on the status memory with the repair statuses specific to particular ones of the row blocks in a portion of the memory array accessed by a command, the update at least partly during a setup time of a memory operation voltage that exceeds a supply voltage of the integrated circuit.

11. A method, comprising:
    receiving a command for an array of memory cells including a set of redundant columns in a plurality of main columns of the array, the plurality of main columns and the set of redundant columns being divided into row blocks, and a particular one of the row blocks in one of the plurality of main columns is repairable by the particular one of the row blocks in one of the set of redundant columns;
    responsive to receiving the command, performing an update on a status memory coupled via a plurality of bit lines to the plurality of main columns of the array, the update including repair statuses of only a subset of the row blocks of the plurality of main columns.

12. The method of claim 11,
    wherein, the repair statuses in the update exclude particular ones of the row blocks outside a portion of the memory array accessed by the command.

13. The method of claim 11,
    wherein, the repair statuses identify repaired main columns in the plurality of main columns that include repairs in a portion of the memory array accessed by the command.

14. The method of claim 11,
    wherein, the repair statuses identify repaired main columns in the plurality of main columns that include repairs in a portion of the memory array accessed by the command, and
    wherein responsive to the repair statuses identifying the repaired main columns, the repaired main columns are excluded from a result of a memory verify procedure for the command.

15. The method of claim 11,
    wherein, the update is performed at least partly during a setup time of a memory operation voltage that exceeds a supply voltage range of an integrated circuit including the array of memory cells.

16. The method of claim 11,
    wherein the row blocks in any one of the set of redundant columns perform repairs in different main columns of the plurality of main columns.

17. The method of claim 11,
wherein the row blocks in any one of the set of redundant columns perform repairs in different main columns of the plurality of main columns, and wherein, the status memory does not include repair statuses of the row blocks outside a portion of the memory array accessed by the command received by the integrated circuit.

18. The method of claim 11,
wherein, the update includes the repair statuses specific to particular ones of the row blocks in a portion of the memory array accessed by the command, the update at least partly during a setup time of a memory operation voltage that exceeds a supply voltage range of an integrated circuit including the array of memory cells.

* * * * *